: US010326101B2

(12) United States Patent
Oh et al.

(10) Patent No.: US 10,326,101 B2
(45) Date of Patent: Jun. 18, 2019

(54) FLEXIBLE DISPLAY DEVICE AND METHOD OF MANUFACTURING THE SAME

(71) Applicant: LG Display Co., Ltd., Seoul (KR)

(72) Inventors: Yeonjun Oh, Gimpo-si (KR); Jonghyun Park, Seosan-si (KR); Seulki Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/841,740

(22) Filed: Dec. 14, 2017

(65) Prior Publication Data
US 2018/0182999 A1    Jun. 28, 2018

(30) Foreign Application Priority Data

Dec. 28, 2016    (KR) .................. 10-2016-0181602

(51) Int. Cl.
| | | |
|---|---|---|
| *H01L 51/52* | (2006.01) | |
| *H01L 51/00* | (2006.01) | |
| *H01L 51/56* | (2006.01) | |
| *H01L 27/32* | (2006.01) | |

(52) U.S. Cl.
CPC ...... *H01L 51/5243* (2013.01); *H01L 51/5246* (2013.01); *H01L 51/56* (2013.01); *H01L 27/3276* (2013.01); *H01L 51/0097* (2013.01); *H01L 2227/323* (2013.01)

(58) Field of Classification Search
CPC ............ H01L 51/5243; H01L 27/3276; H01L 51/0097; H01L 51/56
USPC ........................................... 174/254
See application file for complete search history.

(56) References Cited

U.S. PATENT DOCUMENTS

| | | | |
|---|---|---|---|
| 8,363,189 B2* | 1/2013 | Sampica ........... | B32B 17/10018 349/122 |
| 8,493,529 B2* | 7/2013 | Kobayashi ......... | G02F 1/13394 349/104 |
| 8,872,168 B2* | 10/2014 | Choi .................. | H01L 27/3244 257/40 |
| 9,942,979 B2* | 4/2018 | Park ...................... | H05K 3/389 |
| 2014/0300850 A1* | 10/2014 | Nakamura .......... | G02F 1/13452 349/139 |

\* cited by examiner

*Primary Examiner* — Timothy J Thompson
*Assistant Examiner* — Charles Pizzuto
(74) *Attorney, Agent, or Firm* — Morgan, Lewis & Bockius LLP

(57) ABSTRACT

A flexible display device and method of manufacturing the same are provided. A flexible display device includes a display region and a non-display region, the display region including a plurality of pixels, the non-display region being outside the display region. The flexible display device further includes: a substrate, a side sealant covering at least part of the non-display region of the substrate, and an intermediate layer between the substrate and the side sealant.

21 Claims, 12 Drawing Sheets

(a)

(b)

FLEXIBLE DISPLAY DEVICE AND METHOD OF MANUFACTURING THE SAME

CROSS-REFERENCE TO RELATED APPLICATIONS

This application claims the priority of Korean Application No. 10-2016-0181602, filed on Dec. 28, 2016, the entirety of which is hereby incorporated by reference.

BACKGROUND

1. Technical Field

The present disclosure relates to a display device and, more particularly, to a flexible display device and method of manufacturing the same.

2. Discussion of the Related Art

With the development of information technologies, there are growing demands for display devices, which are a medium for connecting a user to information. Accordingly, display devices, such as an organic light-emitting display device, a liquid crystal display (LCD) and a plasma display panel (PDP), are widely used.

Among them, the organic light-emitting display device is a self-emitting element. Thus, the organic light-emitting display device may consume less power than the LCD, which requires a backlight, and may be made thinner than the LCD. In addition, the organic light-emitting display has advantages of a wide viewing angle and a fast response speed. Technologies of manufacturing an organic light-emitting display has improved so much that it is possible to produce a massive number of large screens. Now, the market for organic light-emitting displays is growing to be comparable to the market for LCDs.

Pixels in an organic light-emitting display device include a self-emitting organic light-emitting diode (OLED). Organic light-emitting display devices may be divided by a type of emission material, an emission type, an emission structure, or a driving method. Organic light-emitting display devices may be divided by an emission type into florescent emission type and phosphorescent emission type, or may be divided by an emission structure into a top-emission structure and a bottom-emission structure. In addition, organic light-emitting display devices may be divided by a driving method into a passive matrix OLED (PMOLED) driving method and an active matrix OLED (AMOLED) driving method.

As flexible display devices are commonly used these days, various types of display devices are being developed. The flexible display devices may be implemented as various types, such as a bendable display device, a foldable display device, rollable display device, and a curved display device. Such flexible display devices may be applied, not just to mobile devices, such as smart phones and table PCs, but also to TVs, automobile displays, and wearable devices. Thus, the flexible display devices can be applied in an increasing number of fields.

SUMMARY

Accordingly, the present disclosure is directed to a flexible display device and method of manufacturing the same that substantially obviate one or more of the issues due to limitations and disadvantages of the related art.

In one aspect, embodiments of the present disclosure may provide a flexible display device that includes an intermediate layer below a side sealant to secure uniformity of the side sealant.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a flexible display device including a display region and a non-display region, the display region including a plurality of pixels, the non-display region being outside the display region, the flexible display device including: a substrate, a side sealant covering at least part of the non-display region of the substrate, and an intermediate layer between the substrate and the side sealant.

In another aspect, there is provided a flexible display device, including: a substrate including: a display region, and a non-display region outside of the display region, a side sealant on the non-display region, and an intermediate layer between the substrate and the side sealant, wherein the intermediate layer includes: a bottom surface in contact with a plurality of regions having different surface properties from each other, and a top surface in contact with a region having one surface property.

In another aspect, there is provided a method of manufacturing a flexible display device including a display region and a non-display region, the display region including a plurality of pixels, the non-display region being outside the display region, the method including: providing a substrate, covering at least part of the non-display region of the substrate with a side sealant, and providing an intermediate layer between the substrate and the side sealant.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain various principles of the disclosure.

Figure 1:
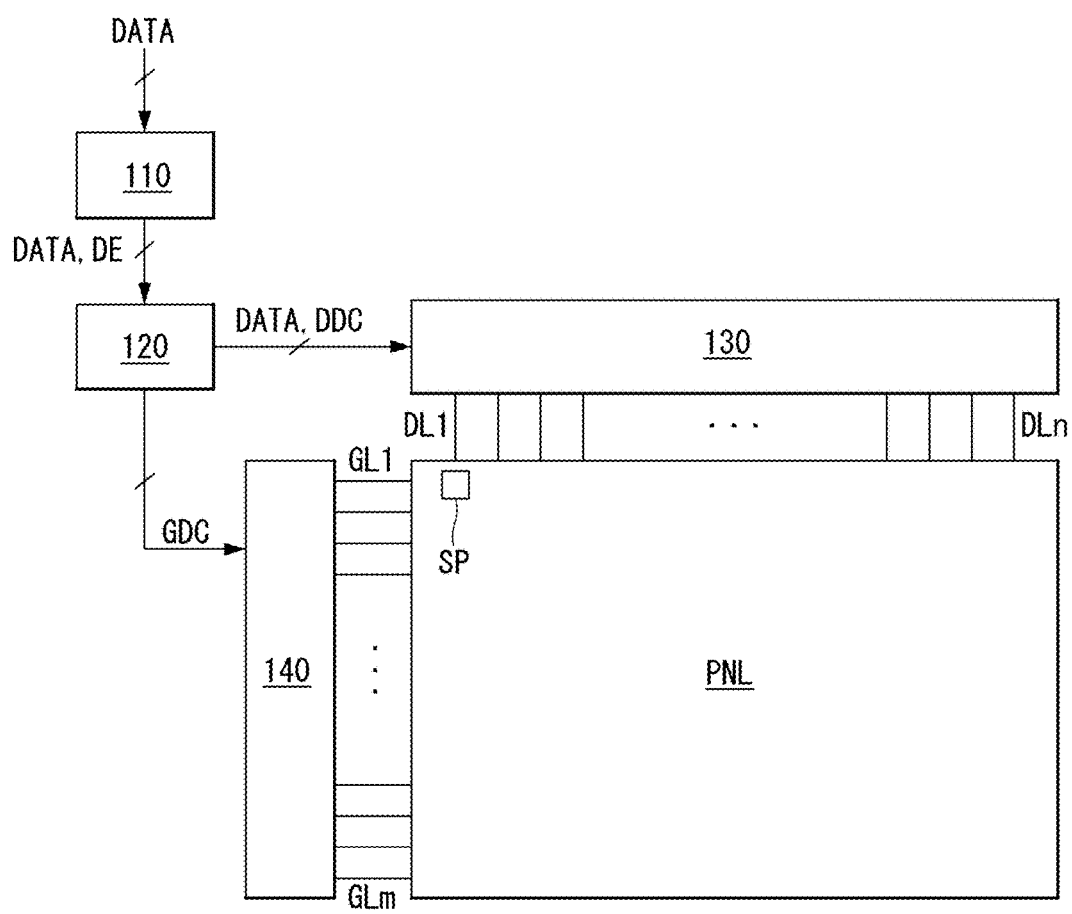
FIG. 1 is a schematic block diagram illustrating a flexible display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of which are illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Figure 2:
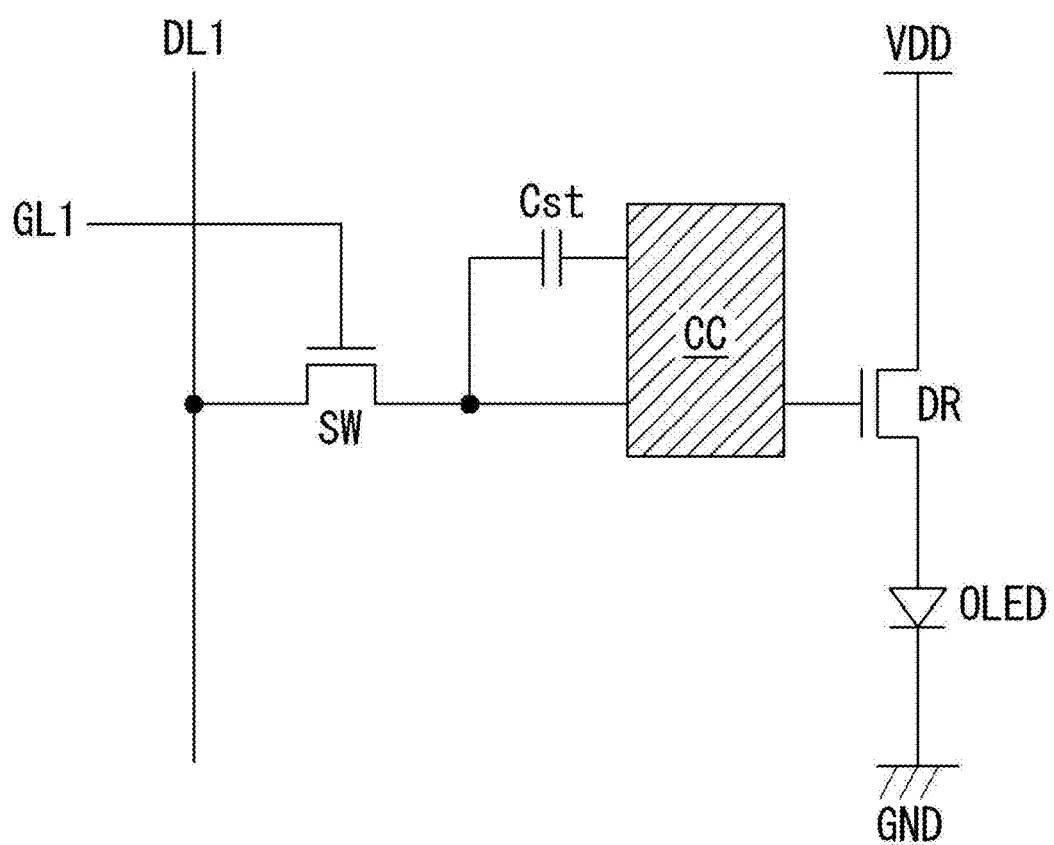
FIG. 2 is a diagram illustrating a circuit of a sub-pixel according to a first embodiment of the present disclosure.
Figure 3:
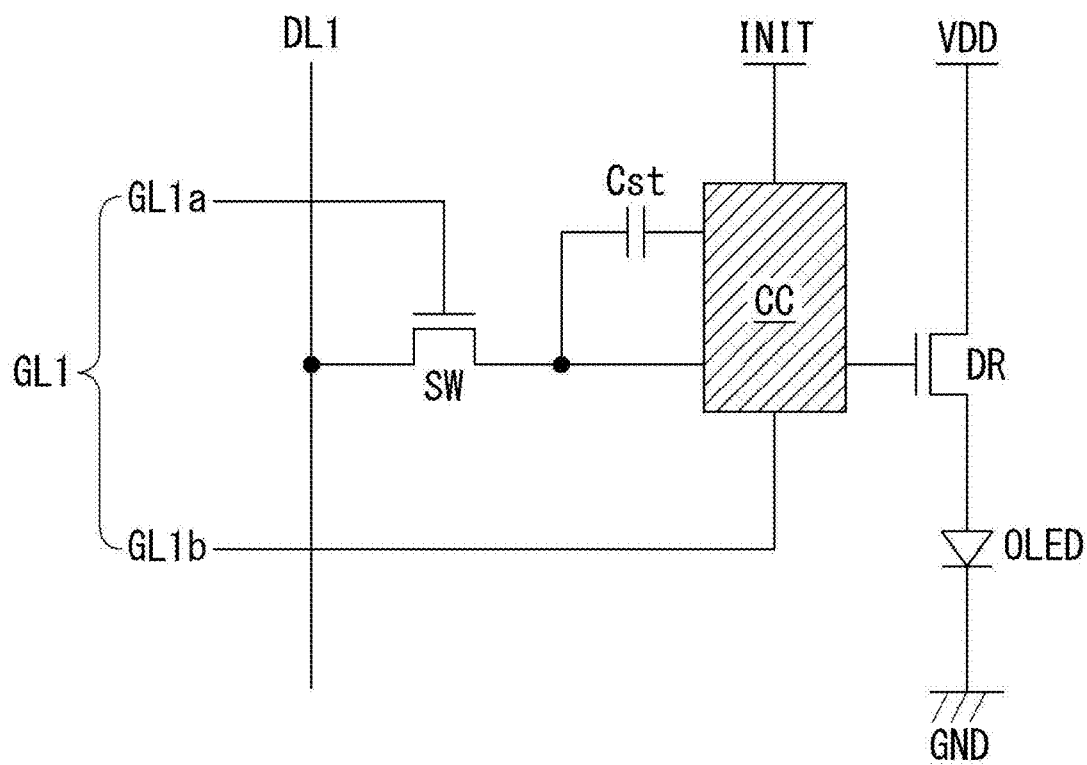
FIG. 3 is a circuit diagram of a sub-pixel according to a second embodiment of the present disclosure.
Figure 4:
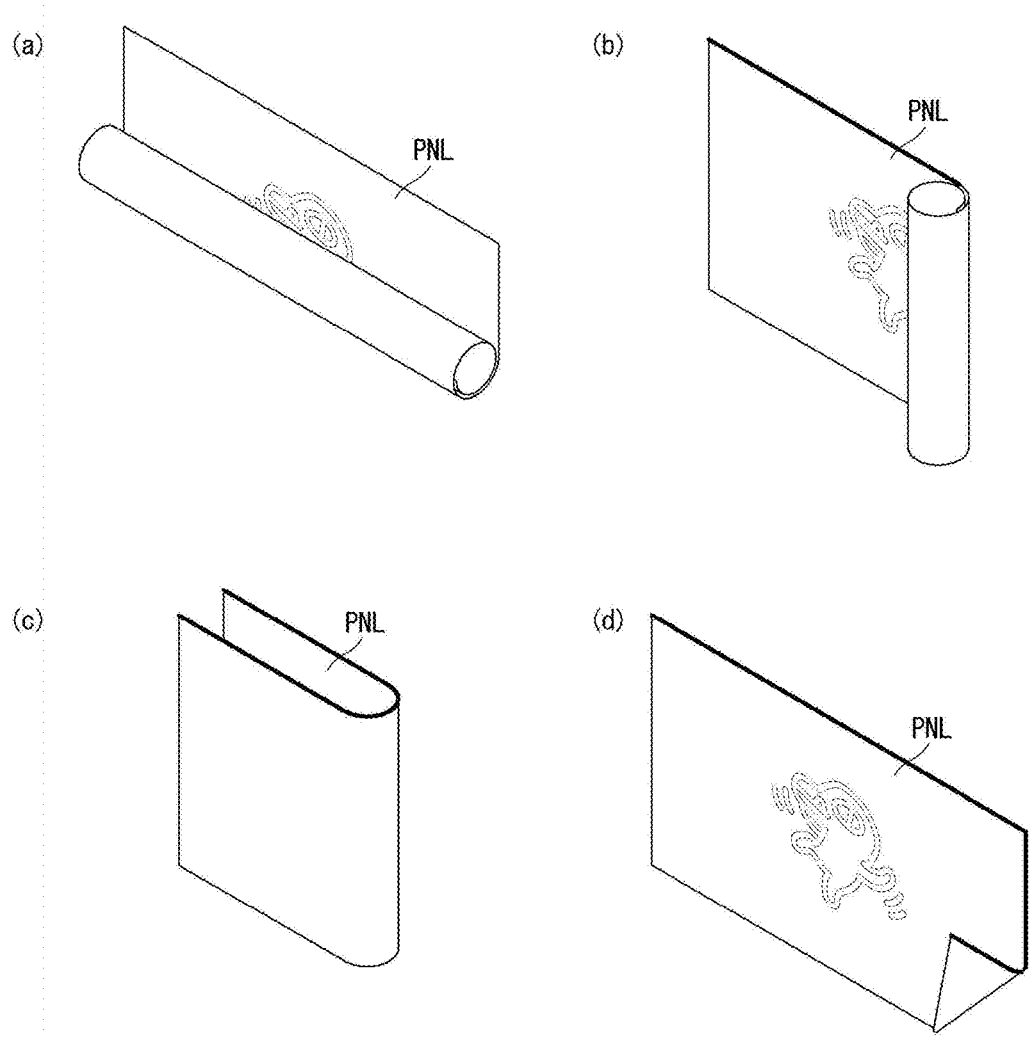
FIG. 4 is perspective views of a flexible display device according to an embodiment of the present disclosure.

FIG. 1 is a schematic block diagram illustrating a flexible display device according to an embodiment of the present disclosure. FIG. 2 is a diagram illustrating a circuit of a sub-pixel according to a first embodiment of the present disclosure. FIG. 3 is a circuit diagram of a sub-pixel according to a second embodiment of the present disclosure. FIG. 4 is perspective views of a flexible display device according to an embodiment of the present disclosure.

With reference to FIG. 1, a flexible display device may include an image processor 110, a timing controller 120, a data driver 130, a gate driver 140, and a display panel PNL. The image processor 110 may output a data enable signal DE along with a data signal DATA supplied from the outside. Apart from the data enable signal DE, the image processor 110 may output at least one of a vertical synchronization signal, a horizontal synchronization signal, and a clock signal, but these signals are not illustrated for convenience of explanation. The image processor 110 may be in the form of an integrated circuit (IC) on a system circuit board, although embodiments are not limited thereto.

The timing controller 120 may be supplied from the image processor 110 with a data signal DATA. The timing controller may also receive a data enable signal DE and/or a driving signal that may include a vertical synchronization signal, a horizontal synchronization signal, and a clock signal. Based on a driving signal, the timing controller 120 may output a gate timing control signal GDC for controlling operation timing of the gate driver 140, and may output a data timing control signal DDC for controlling operation timing of the data driver 130. The timing controller 120 may be in the form of an integrated circuit (IC) on a control circuit board.

In response to a data timing control signal DDC supplied from the timing controller 120, the data driver 130 may sample and latch a data signal supplied from the timing controller 120, may convert the sampled and latched data signal DATA into a gamma reference voltage, and may output the gamma reference voltage. The data driver 130 may output a data signal DATA via data lines DL1 to DLn. The data driver 130 may be in the form of an IC attached to a board.

In response to a gate timing control signal GDC supplied from the timing controller 120, the gate driver 140 may output a gate signal while shifting the level of a gate voltage. The gate driver 140 may output a gate signal via gate lines GL1 to GLm. The gate driver 140 may be in the form of an IC on a gate circuit board, or may be in the form of a gate-in-panel (GIP) circuit on the display panel PNL.

The display panel PNL may display an image in response to a data signal DATA from the data driver 130 and a gate signal from the gate driver 140. The display panel PNL may include sub-pixels SP for displaying an image.

With reference to FIG. 2, a sub-pixel may include a switching transistor SW, a driving transistor DR, a compensation circuit CC, and an organic light-emitting diode (OLED). The OLED may emit light by a driving current, which may be formed by the driving transistor DR. The OLED may include an emission layer disposed between a first electrode, which may be an anode electrode; and a second electrode, which may be a cathode electrode; and may include an organic compound. Accordingly, a hole supplied from the first electrode may be combined in the emission layer with an electron supplied from the second electrode, thereby forming an exciton, which may be an electron-hole pair. The flexible display device may be a self-emitting display device that emits light by energy that may be generated when the exciton returns to the ground state.

In response to a gate signal supplied via a first gate line GL1, the switching transistor SW may perform a switching operation so that a data signal supplied via a first data line DL1 may be stored in a capacitor as a data voltage. By the data voltage stored in the capacitor, the driving transistor DR may operate to allow a driving current to flow between a high-potential power line VDD and a low-potential power line GND, which may be at a ground level, although is not limited thereto. The compensation circuit CC may be a circuit for compensating for a threshold voltage of the driving transistor DR. In addition, a capacitor Cst connected to the switching transistor SW or the driving transistor DR may be located within the compensation circuit CC.

The compensation circuit may include one or more thin film transistors (TFTs) and a capacitor. Configuration of the compensation circuit CC may vary depending on a compensation method. Thus, examples and descriptions thereof may be herein omitted.

In addition, in an example in which the compensation circuit CC is be included, as shown in the FIG. 3 example, a sub-pixel may further include a signal line and a power line to drive a compensation TFT and to supply a particular signal or power. The added signal line may be defined as a 1-2 gate line-b GL1b for driving a compensation TFT included in the sub-pixel. In FIG. 3, "GL1a" may be a 1-1 gate line for driving the switching transistor SW. In addition, the added power line may be defined as an initialization power line INIT for initializing a particular node of the sub-pixel to a particular voltage. However, this is merely an example, and embodiments of the present disclosure are not limited thereto.

Furthermore, FIGS. 2 and 3 show an example in which one sub-pixel includes a compensation circuit CC. However, if a subject of compensation is located outside of a sub-pixel, such as the data driver 130, the compensation circuit CC may be omitted. That is, one sub-pixel may be in a 2T1C (2 TFTs and 1 capacitor) structure that includes a switching transistor SW, a driving transistor DR, a capacitor, and an OLED. If including a compensation circuit CC, a sub-pixel may have various configurations, such as 3T1C, 4T2C, 5T2C, 6T2C, and 7T2C. Embodiments are not limited to these examples.

In addition, FIGS. 2 and 3 show an example in which a compensation circuit CC is disposed between a switching transistor SW and a driving transistor DR. However, the compensation circuit CC may be further disposed between a driving transistor DR and an OLED. The position and structure of the compensation circuit CC may be not limited to the examples shown in FIGS. 2 and 3.

FIG. 4 is an example of the use of a flexible display device. With reference to FIG. 4, the display panel PNL may include a display region in which an image may be displayed. Using the display region AA, a user may recognize information output from the display panel PNL. The display region AA may be defined as one surface, e.g., a top or bottom surface, of the display panel PNL, or may be defined on both surfaces, e.g., top and bottom surfaces, thereof. In addition, if desired, the display region AA may be defined as being limited to being in a particular region of the panel PNL.

Parts (a)-(d) of FIG. 4 show some example positions in which the display panel PNL may be manipulated. The display panel PNL may be rolled or unrolled. That is, it may be possible for the display panel PNL to be rolled (or wound) and unrolled (or unwound) easily and repeatedly because it has flexibility. If necessary, the display panel PNL may be rolled in various directions. For example, the display panel PNL may be rolled in a horizontal and/or vertical direction and/or in a diagonal direction. The display panel PNL may be rolled in a front surface direction of the display panel PNL and/or a rear surface direction of the display panel PNL.

The change in state (rolling and unrolling) of the display panel PNL may be caused by an external physical force applied directly by a user. For example, the user may change a state of the display panel PNL by gripping one end of the display panel PNL and applying force thereto. Change in a state of the display panel PNL may be controlled by a controller in response to a predetermined particular signal. That is, state change of the display panel PNL may be controlled by a selected driving device or driving circuit.

Figure 5:
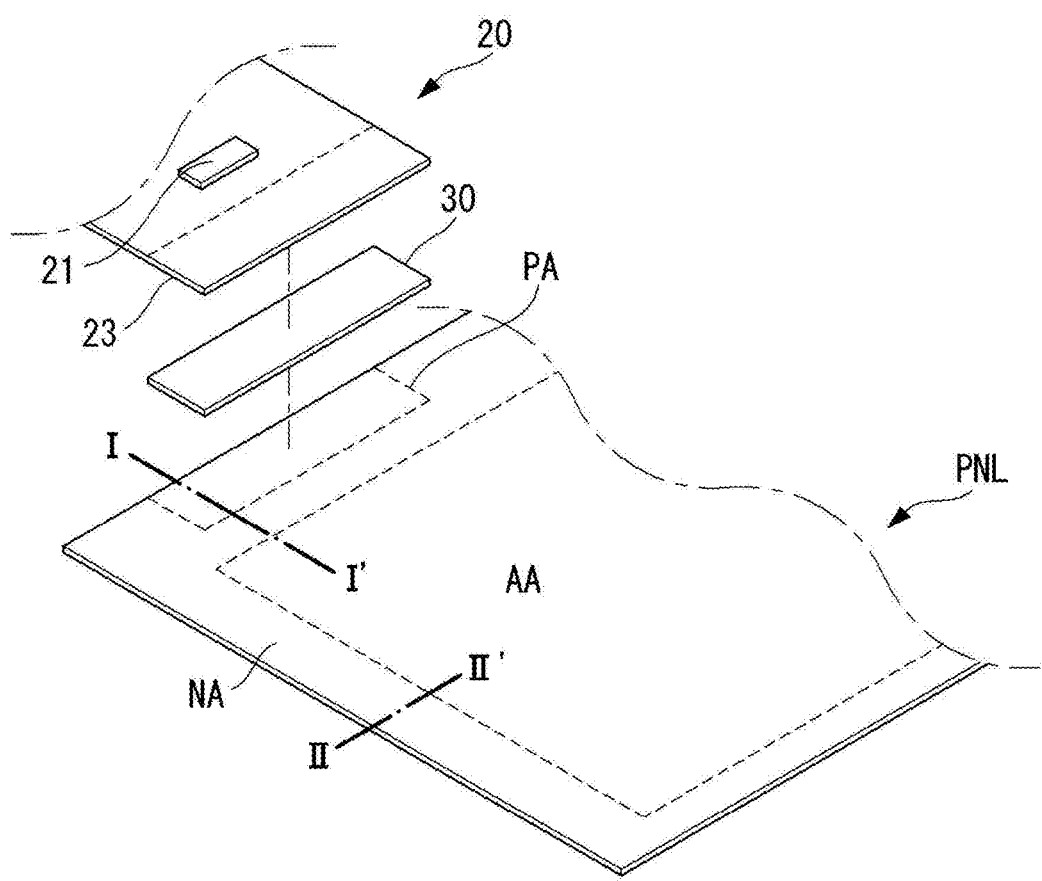
FIG. 5 is a perspective view of a flexible display device according to an embodiment of the present disclosure.
Figure 6:
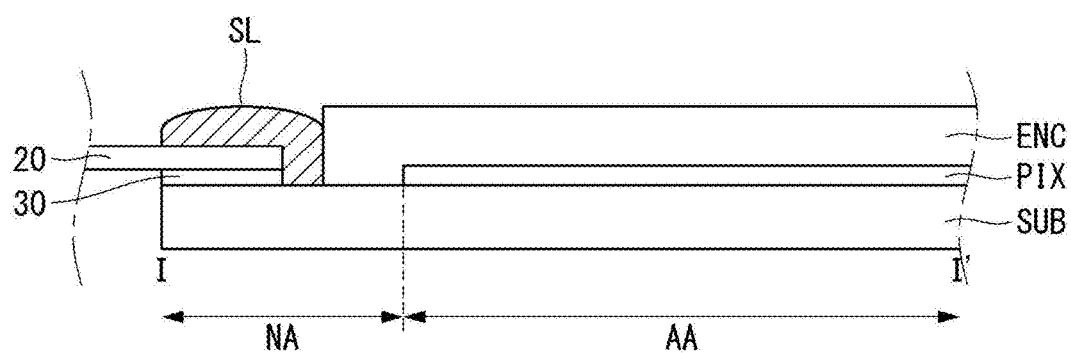
FIG. 6 is a cross-sectional view of FIG. 5 cut along line I-I' according to an embodiment of the present disclosure.
Figure 7:
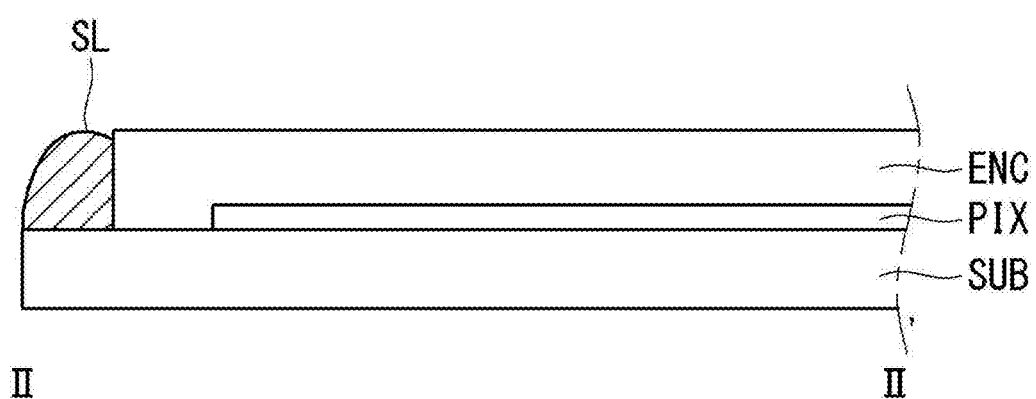
FIG. 7 is a cross-sectional view of FIG. 5 cut along line II-II' according to an embodiment of the present disclosure.

FIG. 5 is a perspective view of a flexible display device according to an embodiment of the present disclosure. FIG. 6 is a cross-sectional view of FIG. 5 cut along line I-I' according to an embodiment of the present disclosure. FIG. 7 is a cross-sectional view of FIG. 5 cut along line II-II' according to an embodiment of the present disclosure.

With reference to FIG. 5, a flexible display device according to an embodiment of the present disclosure may include a display panel PNL, a flexible film 20, and an anisotropic conductive film (ACF) layer 30. The display panel PNL may include a display region, in which an input image may be displayed, and a non-display region NA, which may be outside of the display region AA. A pad portion PA may be defined in one side of the non-display region NA. Pads may be provided in the pad portion PA, and the pads may be connected to signal lines for transferring a driving signal to the display region AA.

The flexible film 20 may be implemented as a chip-on-film (COF) or a tape carrier package (TCP). The flexible film 20 may include a base film 23 and a driver IC 21 mounted on the base film 23. One end of the flexible film 20 may be attached to the pad portion of the display panel PNL, and the other end may be connected to a printed circuit board (PCB). A plurality of elements, such as ICs, may be formed on the PCB to constitute a driver. The driver may generate various control signals and data signals, which may be for driving the display panel PNL, and data signals, and may transfer the signals to the display panel PNL.

The ACF layer 30 may include an adhesive resin and conductive particles dispersed inside the ACF layer 30. The resin may be, e.g., any one selected from a thermoplastic resin (an SBR/polyvinyl/butylene resin), a thermosetting resin (an epoxy/polyurethane/acrylic resin), and a mixture of the thermoplastic resin and the thermosetting resin. Embodiments are not limited to these materials. The ACF layer 30 may be disposed between the pad portion PA of the display panel PNL and one end of the flexible film 20, and the conductive particles may be connected to each other by press heating to electrically connect the display panel PNL and the flexible film 20.

Further, with reference to FIGS. 6 and 7, the flexible display device may include a substrate SUB, a pixel array PIX, an encapsulation layer ENC, a flexible film 20, and a side sealant SL. A display region AA and a non-display region NA may be defined on the substrate SUB. The substrate SUB may be formed of a flexible material, which may be bendable. For example, the substrate may be formed of a material, such as polyimide (PI), polyethylene terephthalate (PET), polyethylene naphthalate (PEN), polycarbonate (PC), polyethersulfone (PES), polyarylate (PAR), polysulfone (PSF), and cyclic-olefin copolymer (COC). Embodiments are not limited to these materials.

The pixel array PIX may include a plurality of pixels. Each pixel may include a plurality of elements, such as a TFT and an OLED connected to the TFT. The pixels PIX may be arranged in the display area AA in an order of red (R), green (G), and blue (B) or in an order of R, G, B, white (W) to realize full colors. These are only examples of orders and colors, and embodiments are not limited thereto. The pixels PIX may be partitioned by gate lines and data lines intersecting each other.

The encapsulation layer ENC may be disposed on the pixel array PIX. The encapsulation layer ENC may be provided to cover the pixel array PIX to block moisture or oxygen which could possibly come inside a pixel. For example, the encapsulation layer ENC may include a metal material. For example, the encapsulation layer ENC may be formed of a material having a low thermal expansion coefficient, such as invar, which may be an Fe—Ni alloy, or steel use stainless (SUS), but embodiments of the present disclosure are not limited thereto. In another example, the encapsulation layer ENC may include an organic material and an inorganic material. In one example, the encapsulation layer ENC may be a multiple layer in which organic materials and inorganic materials are deposited alternately, but embodiments of the present disclosure are not limited thereto.

The side sealant SL may be coated on the non-display region NA, which may be an outside region of the substrate SUB, and which may be exposed to the outside environment. The side sealant SL may be provided in the outer region of the substrate SUB, and may function as a bumper to absorb an external force or may have a moisture-prevention/reduction function. In addition, because a heat-resistant plastic film formed of a flexible material, such as polyimide (PI), may be used as the substrate SUB, the substrate SUB may be folded or rolled during a process or while being used, which may be not intended by the user. The side sealant SL may be provided on the exposed portion of the substrate SUB to function as a support for reducing or preventing any unintended distortion of the substrate SUB.

The side sealant SL may be in contact with a side surface of the encapsulation layer ENC. The side sealant SL may be coated to have a thickness corresponding to the height of the encapsulation layer ENC to thereby compensate for a step between the encapsulation layer ENC and the substrate SUB. Through the step compensation by use of the side sealant SL, it may be possible to reduce or prevent a defect that could occur during a manufacturing process. For example, in an example of a flexible display device, a film lamination process may be performed in which a protective film may be attached to a front surface and/or a rear surface of a display panel. At this point, if there is no compensation for the step between the encapsulation layer ENC and the substrate SUB, a defect, such as occurrence of a bubble in the step, may occur. The defect may cause malfunction of the display device.

The side sealant SL may extend to the edge of the flexible film 20 to cover at least part of the flexible film 20. The side sealant SL may fixate the flexible film 20 attached to the substrate SUB to limit and restrict movement of the flexible film 20. The side sealant SL may reduce or prevent the flexible film 20 from being torn, and may protect a portion where the substrate SUB and the flexible film 20 are adhered to each other.

Figure 8:
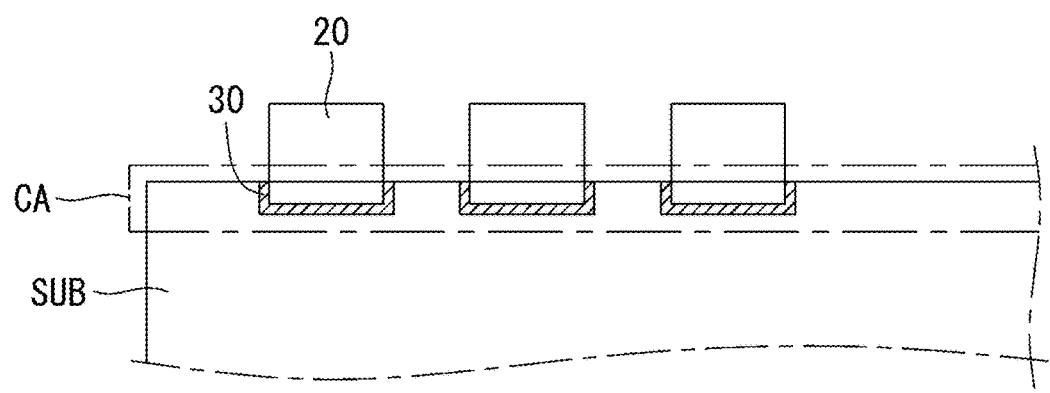
FIGS. 8 and 9 are diagrams showing a problem of a flexible display device.
Figure 9:
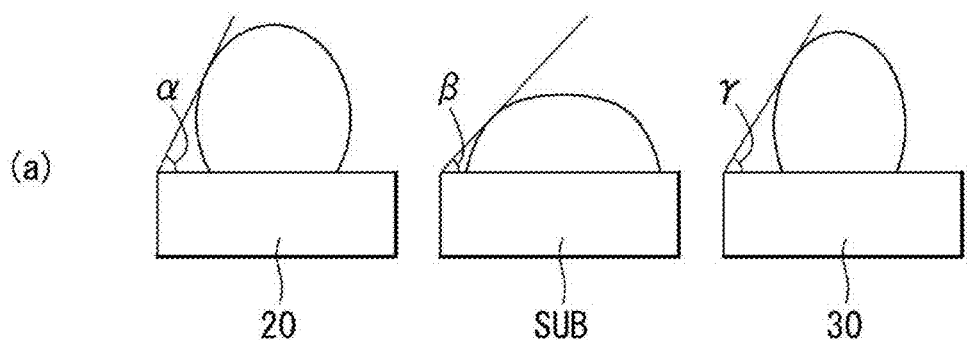
Figure 9:
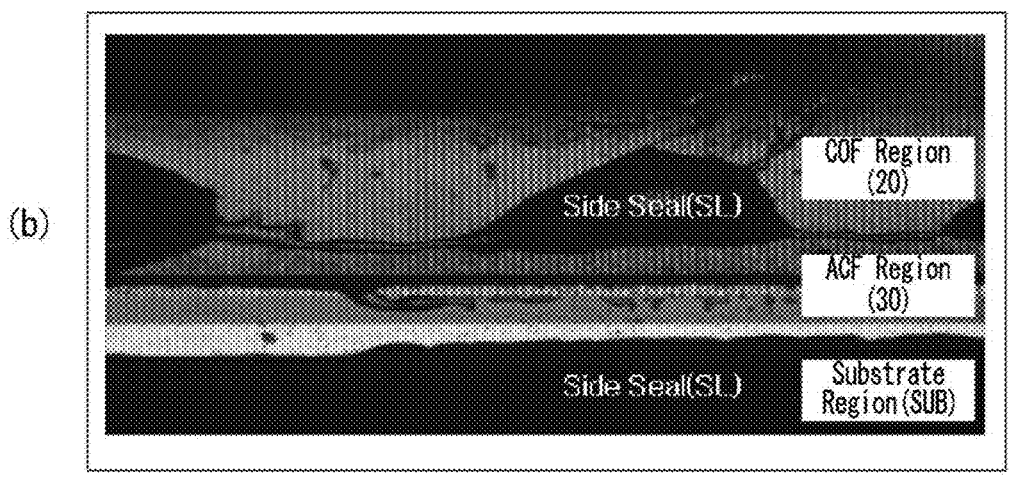

FIGS. 8 and 9 are diagrams showing a problem of a flexible display device.

With reference to FIG. 8, in a region CA on which the side sealant SL is coated, a top layer may be different based on a location. For example, the top layer in the region CA, on which the side sealant SL is coated, may be, e.g., PI, $SiO_x$, or $SiN_x$ in the region of the substrate SUB, may be, e.g., acryl in the region of the ACF layer 30, and may be, e.g., PI in the region of the flexible film 20. These materials are nonlimiting examples. As such, a state of the surface on which the side sealant SL is coated may be different, depending on a location of the surface. Thus, during a side sealing process, the side sealant SL may fail to be coated uniformly over a predetermined region.

For example, if sealant is continuously discharged in one direction using a nozzle, a surface with which the discharged sealants come into contact may have different properties in each region of the substrate SUB, the ACF layer 30, and the flexible film 20. For example, a significant difference in wetting properties may be found due to a difference in physical properties between surfaces with which the sealant comes into contact. Thus, the continuously discharged sealant may fail to be uniformly coated over the top of a surface, and instead it may lump in a particular region or become separate.

In FIG. 9, part (a) is a diagram illustrating differences between contact angles α, β, and γ of sealant discharged to respective regions due to a difference of surface properties between the substrate SUB, the ACF layer 30, and the flexible film 20. In FIG. 9, part (b) is an image in which the side sealant SL is non-uniformly distributed and lumps are in a particular region due to a difference of surface properties between the substrate SUB, the ACF layer 30, and the flexible film 20.

As such, if the side sealant SL is not uniformly distributed, it may be difficult for the side sealant SL to perform the aforementioned functions. In particular, the side sealant SL may be easily delaminated or cracked due to an external force applied when the display panel is rolled, and it may result in the flexible film 20 being separated, and therefore may lead to malfunction of the display device.

EMBODIMENT

Hereinafter, a flexible display device according to an embodiment of the present disclosure will be described with reference to FIGS. 10 to 12.

Figure 10:
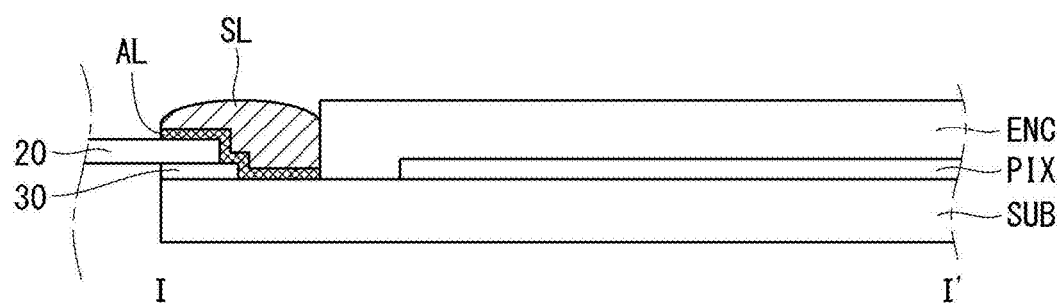
FIG. 10 is a cross-sectional view of FIG. 5 cut along line I-I' according to an embodiment of the present disclosure.

FIG. 10 is a cross-sectional view of FIG. 5 cut along line I-I' according to an embodiment of the present disclosure. FIG. 11 is a cross-sectional view of FIG. 5 cut along line II-II' according to an embodiment of the present disclosure. FIG. 12 is a diagram showing effects of a flexible display device according to an embodiment of the present disclosure.

Figure 11:
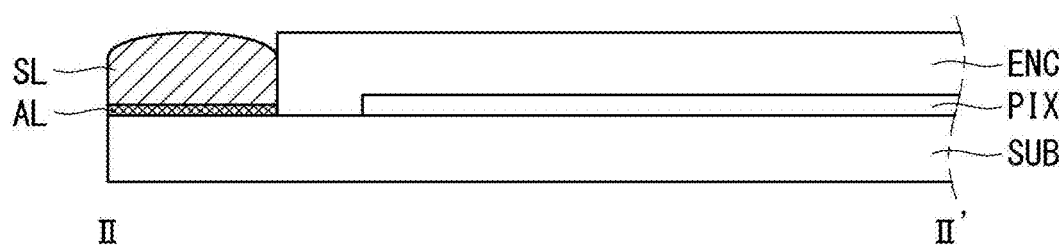
FIG. 11 is a cross-sectional view of FIG. 5 cut along line II-II' according to an embodiment of the present disclosure.

With reference to FIGS. 10 and 11, a flexible display device may include a substrate SUB, a pixel array PIX, an encapsulation layer ENC, a flexible film 20, an intermediate layer AL, and a side sealant SL. A display region AA and a non-display region NA may be defined on the substrate SUB. A pixel array may be provided in the display region AA. The encapsulation layer ENC may be provided to cover the pixel array PIX to protect pixels. A pad portion PA (see FIG. 5) may be disposed in at least one side of the non-display region NA. The non-display region NA may be adhered to the pad portion with the flexible film 20, and the ACF layer 30 may be therebetween.

The side sealant SL may be coated over the non-display region NA. The side sealant SL may be provided at an exposed portion of the substrate SUB (or an insulation layer). The side sealant SL may be in contact, e.g., in direct contact, with a side surface of the encapsulation layer ENC. If desired, the side sealant SL may embrace a side surface of the encapsulation layer ENC to extend to the edge of the top surface of the encapsulation layer ENC.

The side sealant SL may be formed of, e.g., at least one selected from acrylic oligomer, acryl, epoxy, and urethane, but embodiments of the present disclosure are not limited thereto. A thickness of the side sealant SL may be in a range of, e.g., 1 μm to 1 mm. However, embodiments of the present disclosure are not limited thereto.

To reduce or prevent the aforementioned non-uniformly coating of the side sealant SL, the intermediate layer AL may be provided below the side sealant SL. That is, the intermediate layer AL may be provided between the side sealant SL and the substrate SUB (or an insulation layer). The area in which the intermediate layer AL is formed may be substantially equal to or greater than the area in which the side sealant SL may be coated. Here, the term "area" indicates the area on the horizontal plane of each area.

The intermediate layer AL may be formed before coating of the side sealant SL to improve coating uniformity of the sealant SL. In the entire region in which the side sealant SL is coated, a layer below the side sealant SL may be the intermediate layer AL. Thus, a state of a surface of a layer with which sealant continuously discharged in one direction comes in contact may not differ based on a location. Because physical properties of a surface with which the side sealant comes into contact may be substantially the same at any location, the side sealant SL may be uniformly coated over a particular region. The uniformly coated sealant SL may function as the aforementioned buffer, may have the aforementioned moisture-prevention/reduction function, support, and may provide the aforementioned step compensation.

In one example, a material that forms the intermediate layer AL may enable a top surface of the substrate SUB, a top surface of the ACF layer 20, and a top surface of the flexible film 20 to be crosslinked to one other, and the substrate SUB, the ACF layer 20, and the flexible film 20 may all have different surface properties. Accordingly, the material that forms the intermediate layer AL may be easily adhered to base layers having different surface properties.

The intermediate layer AL may cover at least part of the top surface of the ACF layer 30, at least part of the top surface of the flexible film 20, and at least part of the top surface of the substrate SUB (or an insulation layer). The term "part of the top surface" of the ACF layer 30 covered by the intermediate layer AL indicates a part of the ACF layer 30 that may be exposed from the side of the flexible film 20 after the flexible film 20 is adhered to the substrate SUB. If the ACF layer 30 is not exposed outwardly from the flexible film 20, the intermediate layer AL may be provided to cover at least part of the top surface of the flexible film 20 and at least part of the top surface of the substrate SUB (or an insulation layer). In one side of the substrate SUB where the flexible film 20 is not provided, the intermediate layer AL may be provided to cover at least part of the top surface of the substrate SUB (or an insulation layer).

The side sealant SL may be coated on the intermediate layer AL. The material that forms the intermediate layer AL may also enable the side sealant SL to be crosslinked to the base layers to improve adhesion to the side sealant SL. The side sealant SL may be uniformly and strongly adhered to the intermediate layer AL.

The material that forms the intermediate layer AL may be defined as in the following Chemical Formula 1. That is, the intermediate layer AL may be composed of a compound represented by Chemical Formula 1. "X" is a reactor to be chemically adhered to an organic material, such as synthetic resin, and may be, for example, any one selected from mercapto, vinyl, epoxy, amino, and methacryl. "OR" indicates a reactor to be chemically adhered to an inorganic material, such as glass, metal, and silica stone, and "R" may be an alkyl group. The material that forms the intermediate layer AL may be in the basic structure in which Si may be adhered to OR and X. For example, the intermediate layer AL may be composed of silane, silicone rubber, and silicone emulsion. A thickness of the intermediate layer AL may be selected from a range of 1 nm to 1 µm. However, embodiments of the present disclosure are not limited to these examples.

$$(X)n\text{-Si}\text{---}(OR)m,$$ [Chemical Formula 1]

where n=1~3, m=1~3, and (n+m)=4

Due to the above structure, the material that forms the intermediate layer AL may be adhered to homogeneous surfaces of base layers. For example, a bottom surface of the intermediate layer AL may be adhered to an inorganic material (e.g., an inorganic compound such as $SiO_x$ and $SiN_x$) provided on the top surface of the substrate SUB, an organic material (e.g., an organic compound, such as acryl) forming the ACF layer 30, and an organic material (e.g., an organic compound, such as PI) forming the flexible film 20. In addition, a top surface of the intermediate layer may provide the same surface properties as the side sealant SL so that the side sealant SL may be coated uniformly. Although not illustrated in the drawings, the intermediate layer AL may be in contact, e.g., direct contact, with the substrate SUB or with at least one insulation layer provide on the substrate SUB. The insulation layer may be an insulation layer extending from the pixel array PIX.

To form the intermediate layer AL and the side sealant SL, a cleaning procedure for cleaning a region where the side sealant SL is to be coated, a procedure for coating the intermediate layer AL, and a procedure for coating the side sealant SL may be performed in a sequence. The procedure for coating the intermediate layer AL may include coating a material, which may form the intermediate layer AL, on base layers, and curing the material. The procedure for coating the side sealant SL may include coating sealant on the intermediate layer AL and curing the sealant.

Figure 12:
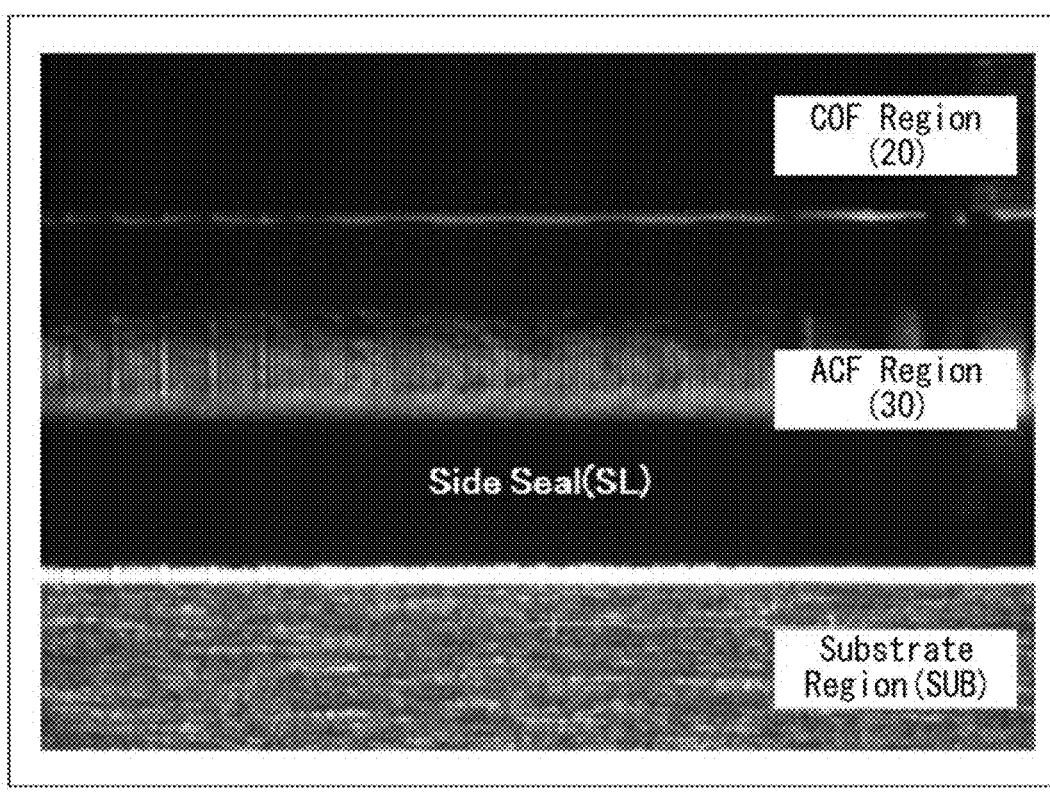
FIG. 12 is a diagram showing effects of a flexible display device according to an embodiment of the present disclosure.

FIG. 12 is an image showing an experiment in which the side sealant SL is uniformly coated by use of the intermediate layer AL provided below, even though the substrate SUB, the ACF layer 30, and the flexible film 20 have different surface properties. In a comparison between FIG. 12 and part (b) of FIG. 9, a side sealant in an existing display device may be non-uniformly coated in one direction and may have lumps (FIG. 9), whereas a side sealant according to an embodiment of the present disclosure may be uniformly coated in one direction (FIG. 12).

An embodiment of the present disclosure may further include the intermediate layer AL so that the side sealant SL may be uniformly coated. Accordingly, it may be possible to achieve uniformity of the side sealant SL to thereby reduce or prevent the side sealant SL from being peeled off or cracked. With the uniformly coated side sealant SL, an embodiment of the present disclosure may be able to absorb an external force and block oxygen and moisture that possibly come inside from the outside. In addition, by supporting the flexible substrate SUB, an embodiment of the present disclosure may reduce or prevent the substrate SUB from being folded or rolled during a process or while being used, which may be not intended by the user. In addition, by restricting movement of the flexible film 20 adhered to the substrate SUB, it may be possible to reduce or prevent the flexible film 20 from being torn and to protect a portion where the substrate SUB and the flexible film 20 are adhered to each other.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A flexible display device including a display region and a non-display region, the display region including a plurality of pixels, the non-display region being outside the display region, the flexible display device comprising:

a substrate;
a side sealant covering at least part of the non-display region of the substrate; and
an intermediate layer between the substrate and the side sealant,
wherein a bottom surface of the intermediate layer is in contact with a plurality of regions having different surface properties from each other.

2. The flexible display device of claim 1, wherein the intermediate layer is a compound represented by the following chemical formula:

$$(X)n\text{-Si}\text{---}(OR)m, \qquad \text{[Chemical Formula 1]}$$

where:
n=1~3,
m=1~3,
(n+m)=4,
X is one of: mercapto, vinyl, epoxy, amino, and methacryl, and
R is an alkyl group.

3. The flexible display device of claim 1, wherein the intermediate layer comprises at least one of: silane, silicone rubber, and silicone emulsion.

4. The flexible display device of claim 1, further comprising:
an anisotropic conductive film (ACF) layer in the non-display region; and
a flexible film adhered to the substrate, the ACF being between the flexible film and the substrate,
wherein the intermediate layer covers:
at least part of the ACF layer,
at least part of the flexible film, and
at least part of the substrate.

5. The flexible display device of claim 4, wherein the intermediate layer is in contact with the substrate or with at least one insulation layer provided on the on the substrate.

6. The flexible display device of claim 1, further comprising:
an anisotropic conductive film (ACF) layer in the non-display region; and
a flexible film adhered to the substrate, the ACF being between the flexible film and the substrate,
wherein the intermediate layer covers:
at least part of the flexible film, and
at least part of the substrate.

7. The flexible display device of claim 6, wherein the intermediate layer is in contact with the substrate or with at least one insulation layer provided on the on the substrate.

8. The flexible display device of claim 1, wherein an area of the intermediate layer is greater than or equal to an area of the side sealant.

9. The flexible display device of claim 1, further comprising:
an anisotropic conductive film (ACF) layer in the non-display region; and
a flexible film adhered to the substrate, the ACF being between the flexible film and the substrate,
wherein the side sealant covers at least part of the flexible film.

10. The flexible display device of claim 1, further comprising:
an encapsulation layer covering the pixels,
wherein the side sealant is in contact with the encapsulation layer.

11. A flexible display device, comprising:
a substrate comprising:
a display region; and
a non-display region outside of the display region;
a side sealant on the non-display region; and
an intermediate layer between the substrate and the side sealant,
wherein the intermediate layer comprises:
a bottom surface in contact with a plurality of regions having different surface properties from each other, and
a top surface in contact with a region having one surface property.

12. A method of manufacturing a flexible display device including a display region and a non-display region, the display region including a plurality of pixels, the non-display region being outside the display region, the method comprising:
providing a substrate;
covering at least part of the non-display region of the substrate with a side sealant; and
providing an intermediate layer between the substrate and the side sealant,
wherein a bottom surface of the intermediate layer is in contact with a plurality of regions having different surface properties from each other.

13. The method of claim 12, wherein providing the intermediate layer comprises providing a compound represented by the following chemical formula:

$$(X)n\text{-Si}\text{---}(OR)m, \qquad \text{[Chemical Formula 1]}$$

where:
n=1~3,
m=1~3,
(n+m)=4,
X is one of: mercapto, vinyl, epoxy, amino, and methacryl, and
R is an alkyl group.

14. The method of claim 12, wherein providing the intermediate layer comprises providing at least one of: silane, silicone rubber, and silicone emulsion.

15. The method of claim 12, further comprising:
providing an anisotropic conductive film (ACF) layer in the non-display region; and
adhering a flexible film to the substrate, the ACF being between the flexible film and the substrate,
wherein the intermediate layer covers:
at least part of the ACF layer,
at least part of the flexible film, and
at least part of the substrate.

16. The method of claim 15, wherein the intermediate layer is in contact with the substrate or with at least one insulation layer provided on the on the substrate.

17. The method of claim 12, further comprising:
providing an anisotropic conductive film (ACF) layer in the non-display region; and
adhering a flexible film to the substrate, the ACF being between the flexible film and the substrate,
wherein the intermediate layer covers:
at least part of the flexible film, and
at least part of the substrate.

18. The method of claim 17, wherein the intermediate layer is in contact with the substrate or with at least one insulation layer provided on the on the substrate.

19. The method of claim 12, wherein an area of the intermediate layer is greater than or equal to an area of the side sealant.

20. The method of claim 12, further comprising:
providing an anisotropic conductive film (ACF) layer in the non-display region; and adhering a flexible film to the substrate, the ACF being between the flexible film and the substrate, wherein the side sealant covers at least part of the flexible film.

21. The method of claim 12, further comprising:

covering the pixels with an encapsulation layer, wherein the side sealant is in contact with the encapsulation layer.

* * * * *